(12) United States Patent
Lee

(10) Patent No.: US 7,038,963 B2
(45) Date of Patent: May 2, 2006

(54) CURRENT SENSE AMPLIFIER CIRCUITS HAVING A BIAS VOLTAGE NODE FOR ADJUSTING INPUT RESISTANCE

(75) Inventor: Sang-Bo Lee, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/068,353

(22) Filed: Feb. 28, 2005

(65) Prior Publication Data

US 2005/0195672 A1 Sep. 8, 2005

(30) Foreign Application Priority Data

Mar. 3, 2004 (KR) ...................... 10-2004-0014234

(51) Int. Cl.
*G11C 7/02* (2006.01)
(52) U.S. Cl. .................. 365/207; 365/189.09
(58) Field of Classification Search ................ 365/208, 365/207, 205, 189.08, 189.09
See application file for complete search history.

(56) References Cited

U.S. PATENT DOCUMENTS

| | | | |
|---|---|---|---|
| 4,988,954 A * | 1/1991 | Stern et al. .................. | 330/264 |
| 5,701,268 A * | 12/1997 | Lee et al. .................... | 365/205 |
| 6,081,138 A | 6/2000 | Kusaba ......................... | 327/55 |
| 6,396,310 B1 | 5/2002 | Shin ............................. | 327/55 |
| 6,424,577 B1 | 7/2002 | Sim ...................... | 365/189.05 |
| 6,469,546 B1 * | 10/2002 | Matano ........................ | 327/51 |
| 6,476,646 B1 * | 11/2002 | Sim et al. ..................... | 327/55 |
| 6,563,737 B1 * | 5/2003 | Khouri et al. .......... | 365/185.21 |
| 6,624,698 B1 * | 9/2003 | Nagaraj ...................... | 330/258 |
| 6,919,766 B1 * | 7/2005 | Suzuki ........................ | 330/252 |

* cited by examiner

*Primary Examiner*—Richard Elms
*Assistant Examiner*—Hien Nguyen
(74) *Attorney, Agent, or Firm*—Myers Bigel Sibley & Sajovec, P.A.

(57) ABSTRACT

A current sense amplifier includes first and second P type MOS transistors having source nodes connected to first and second sensing inputs, respectively, and gate and drain nodes being cross-coupled to each other. First and second N type MOS transistors have drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage. Third and fourth N type MOS transistors have drain nodes connected to the first and second sensing outputs, respectively, and gate nodes connected to a bias voltage node so that respective current paths are established from the first and second sensing outputs to a common reference node.

13 Claims, 10 Drawing Sheets

CURRENT SENSE AMPLIFIER CIRCUITS HAVING A BIAS VOLTAGE NODE FOR ADJUSTING INPUT RESISTANCE

RELATED APPLICATION

This application claims the benefit of and priority to Korean Patent Application No. 2004-14234, filed Mar. 3, 2004, the disclosure of which is hereby incorporated herein by reference.

FIELD OF THE INVENTION

The present invention relates generally to integrated circuit devices and methods of operating the same and, more particularly, to integrated circuit memory devices that incorporate a sense amplifier circuit and methods of operating the same.

BACKGROUND OF THE INVENTION

Generally, as a chip size of a semiconductor memory increases, a length of a data line that is used for transporting data increases as well. Accordingly, a current sense amplifier, which may be relatively less influenced from capacitive loads of data lines as compared to a voltage sense amplifier, may be used in semiconductor memory devices. In a current sense amplifier, because it does not have voltage a difference on data lines, the data lines need not be equalized even when different data are successively transferred. Therefore, the current sense amplifier may be advantageously applied when an operation speed of the memory increases.

Unfortunately, conventional current sense amplifiers may be restricted to low voltage operation environments. Moreover, conventional current sense amplifiers may experience degradation in operation stability and/or sensing delay increases.

FIG. 1 is a circuit diagram of a conventional current sense amplifier circuit that is configured for use in a semiconductor memory device, such as dynamic random access memory (hereinafter, referred to as DRAM) and the like. Referring to FIG. 1, a configuration is shown in which a bit line sense amplifier (B/L S/A) 10, a current sense amplifier 20, and a differential amplifier 30 are connected. If data in a memory cell (not shown), which is sensed as data 0 or 1 by the bit line sense amplifier 10 in a read operation mode, is sent to a pair of data lines DL and /DL, then the current sense amplifier 20, which operates in response to sensing enable signals EN and ENB, current-senses the data to provide current sensing outputs SO and /SO. The current sensing outputs SO and /SO of the current sense amplifier 20 are applied to inputs of the differential amplifier 30, are voltage-amplified, and are transmitted to a data output circuit (not shown).

FIG. 2 is a circuit schematic that illustrates exemplary operations of a conventional current sense amplifier circuit, which is used in a DRAM application. The data in the memory cell sensed by the bit line sense amplifier 10 is transmitted to the pair of data lines DL and /DL when column selection lines CSL are enabled. In FIG. 2, it is assumed that a difference between currents generated by the bit line sense amplifier 10 is denoted by I, and $C_{IO}$ is denoted as a capacitive load of the pair of data lines DL and /DL. In the figure, P type MOS transistors M5 and M6 respectively connected to the bit line pair BL and /BL are load transistors and serve to provide an operation current to the current sense amplifier 20. Assuming that each of the currents flowing through the P type MOS transistors M5 and M6 is i, a current flowing through a node A, which will be a first output of the current sense amplifier 20, is i−I, and a current flowing through a node B, which will be a second output, is i. That is, a difference between the currents flowing through the node A and the node B is I.

If the P type MOS transistors M1 and M3 constituting the current sense amplifier 20 operate in a saturation area and have the same size, voltage differences between the gates and the sources of the MOS transistors M1 and M3 become approximately identical to each other. That is, VGS1=VGS3=V1. In the same way, if the P type MOS transistors M2 and M4 operate in a saturation area and have the same size, then VGS2=VGS4=V2. Because a selection signal YSEL is zero when the column selection line CSL operates, the input node voltages on the column selection lines CSL are each V1+V2 and have about the same voltage. As a result, because the currents into the column selection lines CSL have a difference of I but the voltages on the input nodes are equally maintained, there is virtually no voltage difference generated. As a result, the input resistance $R_{IN}$ of the column selection line CSL becomes approximately zero. Accordingly, the pair of data lines DL and /DL are able to transmit the data in a full current mode.

That is, $R_{IN}=\Delta v_{IN}/\Delta i_{IN}=0/I=0$. When $R_{IN}$ is expressed by transconductance of each of the transistors, the following equation is obtained: $R_{IN}=\{2(gm34-gm12)\}/gm12 \times gm34$. In the foregoing equation, gm is the transconductance of the MOS transistors. Assuming a symmetrical design, gm1=gm2=gm12 and gm3=gm4=gm34. To meet a condition that $R_{IN}$ is zero, gm12=gm34. That is, the transconductance of the MOS transistors M1 and M2 constituting the cross-coupled latch circuit is the same as the transconductance of the current source transistors M3 and M4 preventing a latch operation.

If $R_{IN}<0$, namely, the transconductance of the N type MOS transistors M1 and M2 constituting the cross-coupled latch circuit is larger than that of the current source transistors M3 and M4 preventing the latch operation, then the column selection line CSL may have similar properties as a latch, which may degrade operation stability.

On the other hand, if $R_{IN}>0$, then the column selection line CSL may operate in a voltage operation mode. Unfortunately, data transmission speed may be reduced because a voltage difference is generated between two inputs of the column selection line CSL.

A size ratio of the P type MOS transistors M1 and M2 and the P type MOS transistors M3 and M4 may be adjusted for the column selection line CSL to have zero input resistance $R_{IN}$. However, although $R_{IN}=0$ may be met under particular conditions, variation of the operation voltage or the operation temperature may prevent the result of $R_{IN}=0$ from being met. This is because gm12 and gm34 are not always maintained in the same ratio.

Operation at low voltage, however, may prevent each of the transistors of the column selection line CSL from maintaining its saturation mode, which may result in a greater change in $R_{IN}$. Because the column selection line CSL has, as a required minimum voltage level, a voltage drop from the bit line sense amplifier to the input of the column selection line CSL plus a threshold voltage of the transistor M1 plus a swing voltage at the node A plus a threshold voltage of the transistor M3, the operation voltage of 2V or less allows the transistors of the column selection line CSL to be operated out of the saturation mode. Accordingly, ideal column selection line CSL functionality may be lost.

Referring back to FIG. 1, operations of a non-ideal column selection line CSL will now be described. Generally, to avoid an unstable operation of the column selection line CSL, $R_{IN}$ is initially designed to have a value a little greater than zero. This allows $R_{IN}$ to maintain a positive value even when process, voltage, and temperature (hereinafter, PVT) variation occurs. Accordingly, a voltage changes with a current change at the input node of the column selection line CSL. When a current flows in the bit line sense amplifier 10 of FIG. 1, the voltage on the complementary data line/DL becomes greater than the voltage on the data line DL if $R_{IN}$ is greater than zero. Accordingly, the load currents IM5 and IM6 generated from the P type MOS transistors M5 and M6 for load current generation are no longer the same. That is, if the voltage on the complementary data line/DL is higher than the voltage on the data line DL, then the load current IM6 becomes less than the load current IM5. Two problems may arise in this case.

First, the current difference generated between the two nodes of the current sense amplifier 20 is given by $/I_{SO}-I_{SO}=I_{M6}-(I_{M5}-I)$. Because the current IM6 is less than the current IM5, the current difference value is less than I. Because the current difference I generated by the bit line sense amplifier 10 is not entirely delivered to the current sense amplifier 20, the voltage swing on the output nodes SO and /SO resulting from the current difference decreases. Further, because the voltages on the output nodes SO and /SO become inputs to the differential amplifier 30 connected to a next stage, it may degrade the operation speed of the differential amplifier.

Second, if data from the different bit line sense amplifiers 10 are successively sensed, then a sensing speed may be reduced when the data from the bit line sense amplifiers 10 are the same. Consider the case where several input/output (I/O) lines are connected to the pair of data lines DL and /DL and are connected to one current sense amplifier to perform the sensing operation and different column selection lines CSL are selected for performing the successive operation. If the current difference, $/I_{SO}-I_{SO}=I_{M6}-(I_{M5}-I)$ is generated at both sides and then a first column selection line CSL is off to select another column selection line CSL. As a result, I=0 and the current difference between both sides becomes $I_{M6}-I_{M5}$. Accordingly, the current takes an opposite direction and the voltages on the outputs SO and /SO also vary. As the voltages on the pair of data lines DL and /DL become gradually the same, the current difference vanishes. In the case where the subsequent column selection line CSL is enabled and the current in the bit line sense amplifier 10 is again supplied to the current sense amplifier 20 before the voltages on the pair of data lines DL and /DL become the same, the current direction must change again if the data of the bit line sense amplifier 10 is identical to previous data. Because the voltages on the sensing outputs SO and /SO change, sensing delay may increase.

Because the problems discussed above may arise when the input resistance $R_{IN}$ of the column selection line CSL is larger than zero, the input resistance $R_{IN}$ may be designed to be zero if possible.

FIG. 3 is a diagram that illustrates simulation waveforms of signals related to a sensing output of FIG. 1. There is shown in the figure results obtained by simulation-measuring voltages on the pair of data lines DL and /DL that are the inputs to the current sense amplifier, the voltage on the sensing outputs SO and /SO, and the voltage on the output OUT of the differential amplifier 30 while the bit line sense amplifier 10 data are changed. An abscissa axis denotes time and an ordinate axis denotes voltage.

FIG. 4 is a graph that illustrates maximum voltage difference between a pair of data lines generated when external environment factors change in the circuit of FIG. 1. In FIG. 4, there is shown a measured and plotted result of a maximum voltage difference between the pair of data lines DL and /DL, where VDD=1.6V, 2V, 2.5V and 3V and the temperature is −5° C., 50° C. and 110° C. Here, an abscissa axis denotes voltage and an ordinate axis denotes voltage difference. It can be seen that as the operation voltage is reduced and in turn the input resistance $R_{IN}$ of the column selection line CSL increases, the voltage difference between the pair of data lines DL and /DL increases. If the transistors constituting the current sense amplifier 20 are changed in size for the input resistance $R_{IN}$ of the column selection line CSL at the low voltage to be zero, then the input resistance $R_{IN}$ becomes negative (−) when VDD is high, which may cause a stability problem.

FIG. 5 shows results obtained by simulation-measuring a time beginning from a time of enabling the column selection line CSL to a time until the output OUT node reaches 500 mV, namely, a sensing delay in the circuit of FIG. 1. As the operation voltage decreases, the speed of the differential amplifier 30, which receives as its inputs the outputs from the current sense amplifier 20, is reduced. In addition, the output voltage swing of the current sense amplifier 20 (voltage swing at the SO and /SO nodes) may be reduced depending on the increase of the input resistance $R_{IN}$ of the column selection line CSL, which may cause a problem in that the sensing delay further increases. This is because the current sense amplifier needs an operation voltage, which is greater than the voltage drop from the output of the bit line sense amplifier 10 to the input of the current sense amplifier 20 plus the threshold voltage of the M1 transistor plus the swing voltage at the node A plus the threshold voltage of the M3 transistor.

It is known that the P type MOS transistors M3 and M4 shown in FIGS. 1 and 2 may be replaced by N type MOS transistors and the gate bias may be set to a constant voltage. Such technology is described, for example, by J. Y. Sim et al., in Double boosting, Hybrid Current sense Amplifier, and Binary Weighted Temperature Sensor Adjustment Schemes for 1.8V 128 Mb Mobile DRAMs Symp. in VLSI circuit digest of Technical Papers, 2002, pp 294–297. This may allow the threshold voltage drop in the P type MOS transistors M3 and M4 to be reduced or eliminated, resulting in an enhanced low voltage operation characteristic. Thus, because a phenomenon that the input resistance $R_{IN}$ suddenly increases at a low voltage may be reduced, an operation characteristic may be enhanced. However, there is still a problem that the change in the input resistance $R_{IN}$ becomes greater because the PMOS transistors constituting the cross-coupled latch and the NMOS transistors for latch prevention have a current pass characteristic difference therebetween due to PVT variation.

SUMMARY OF THE INVENTION

According to some embodiments of the present invention, a current sense amplifier comprises first and second P type MOS transistors having source nodes connected to first and second sensing inputs, respectively, and gate and drain nodes being cross-coupled to each other. First and second N type MOS transistors have drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage. Third and fourth N type MOS transistors have drain nodes connected to the first and second sensing outputs, respectively, and gate nodes connected to a bias voltage node so that respective current paths are established from the first and second sensing outputs to a common reference node.

In other embodiments of the present invention, a fifth N type MOS transistor connects the source nodes of the first, second, third, and fourth N type MOS transistors to the common reference node responsive to an operation enable signal.

In still other embodiments of the present invention, an operational amplifier has non-inverting and inverting input nodes connected to the first and second sensing inputs, respectively, and an output node connected to the bias voltage node, wherein the operational amplifier generates a bias voltage at the output node thereof so that the non-inverting input node and the inverting input node are driven to about a same voltage level.

In still other embodiments of the present invention, a bias voltage generator supplies a bias voltage to the bias voltage apply node.

In still other embodiments of the present invention, the bias voltage generator comprises third and fourth P type MOS transistors having source nodes connected to first and second dummy sensing inputs, respectively, and gate and drain nodes being cross-coupled to each other. Sixth and seventh N type MOS transistors have drain nodes connected to the first and second dummy sensing outputs, respectively, the first and second dummy sensing outputs corresponding to the drain nodes of the third and fourth P type MOS transistors, the sixth and seventh N type MOS transistors having gate nodes connected to the power supply voltage. Eighth and ninth N type MOS transistors have drain nodes connected to the first and second dummy sensing outputs, respectively, and gate nodes connected to the bias voltage node so that a current path is established from the first and second dummy sensing outputs to the common reference node. A tenth N type MOS transistor connects the source nodes of the sixth, seventh, eighth and ninth N type MOS transistors to the common reference node. An operational amplifier has non-inverting and inverting input nodes connected to the first and second dummy sensing inputs, respectively, and an output node connected to the bias voltage node, wherein the operational amplifier generates a bias voltage at the output node thereof so that the non-inverting input node and the inverting input node are driven to about a same voltage level.

In still other embodiments of the present invention, the first and second P type MOS transistors are about the same size as the third and fourth P type MOS transistors, respectively, and the first, second, third, and fourth N type MOS transistors are about the same size as the sixth, seventh, eighth, and ninth N type MOS transistors, respectively.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
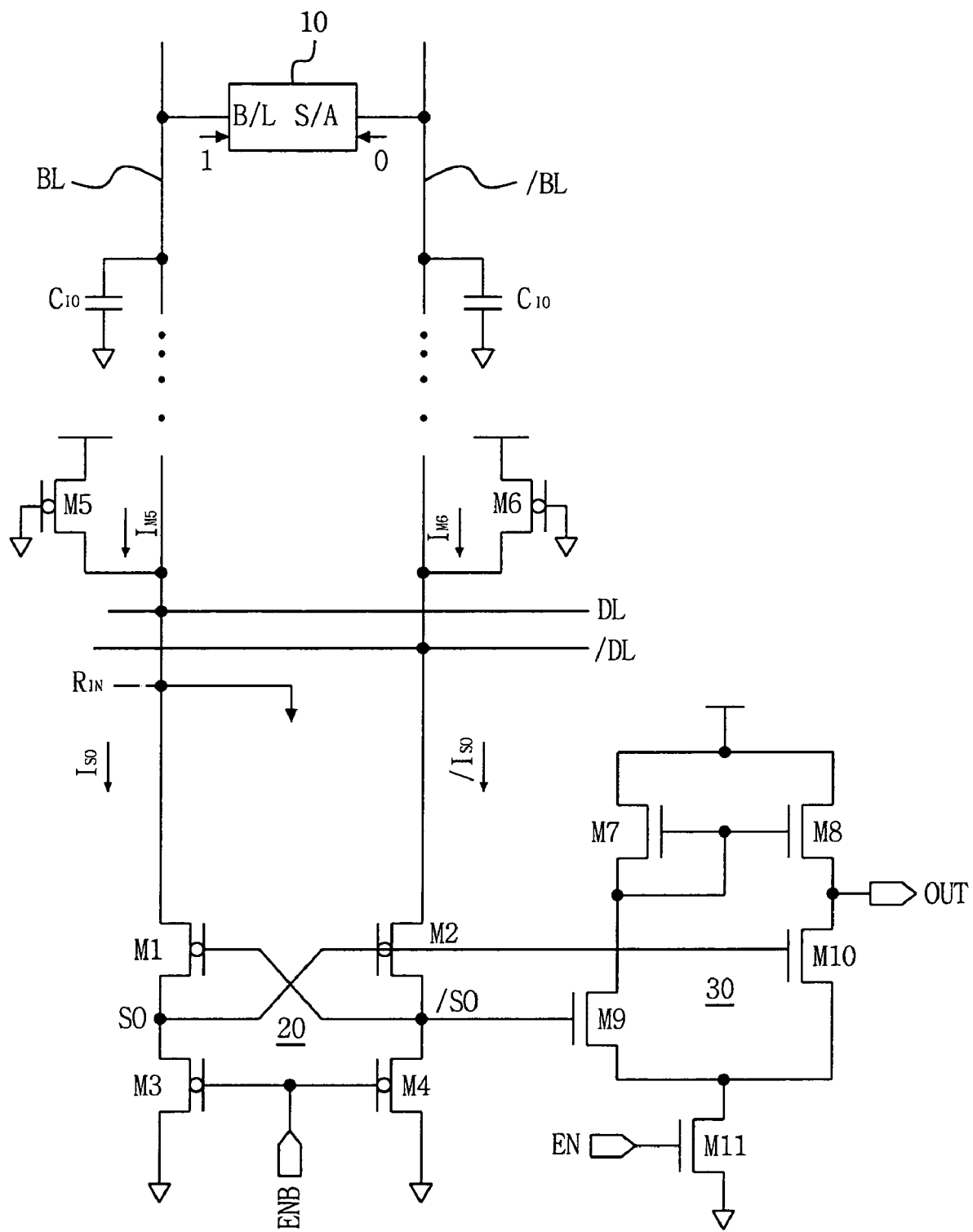
FIG. 1 is a circuit diagram of a conventional current sense amplifier circuit that is configured for use in a semiconductor memory device, such as dynamic random access memory.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

It will be understood that although the terms first and second are used herein to describe various components, these components should not be limited by these terms. These terms are only used to distinguish one component from another component. Thus, a first component discussed below could be termed a second component, and similarly, a second component may be termed a first component without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 6:
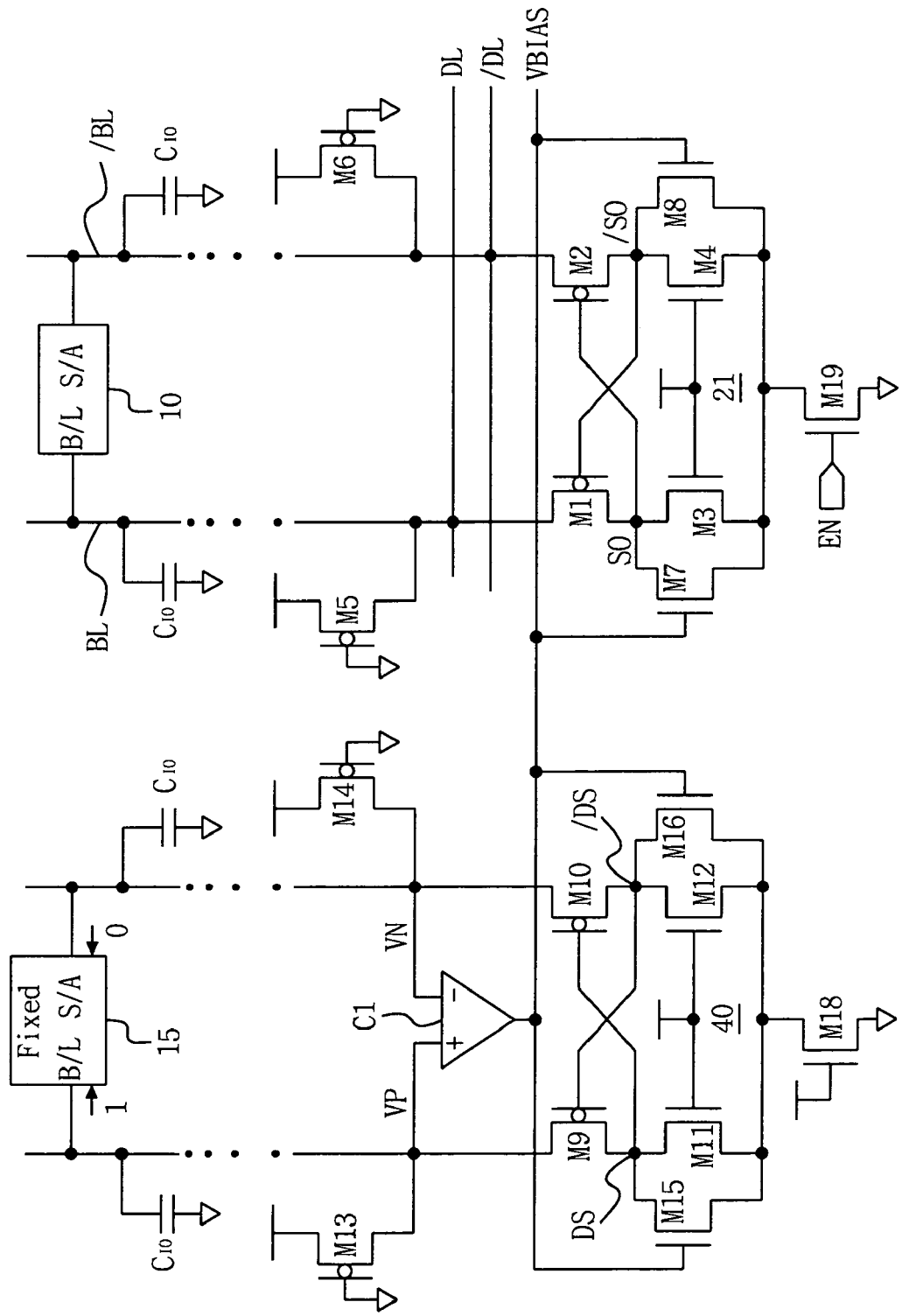
FIG. 6 is a schematic of a sensing circuit according to some embodiments of the present invention.

A circuit comprising a current sense amplifier 21 and a bias voltage generator 40, according to some embodiments of the present invention, is illustrated in FIG. 6. The current sense amplifier 21 comprises NMOS transistors that are substituted for the P type MOS transistors M3 and M4 shown in FIGS. 1 and 2, and NMOS transistors for establishing a current path are additionally connected in parallel with the substituted NMOS transistors.

The current sense amplifier circuit 21 comprises first and second P type MOS transistors M1 and M2 having gate and drain nodes being cross-coupled to each other, and source nodes each connected to first and second sensing inputs DL and /DL, the drain node being the first and second sensing outputs SO and /SO. The current sense amplifier circuit 21 further comprises first and second N type MOS transistors M3 and M4 having drain nodes each connected to the first and second sensing outputs SO and /SO, and gate nodes connected to a power supply voltage (VDD) apply node in common. The current sense amplifier circuit 21 further comprises third and fourth N type MOS transistors M7 and M8 having drain nodes each connected to the first and second sensing outputs SO and /SO, and gate nodes connected in common to a bias voltage (VBIAS) apply node, so that a current path is established from the first and second sensing outputs SO and /SO to a ground GND. And, the current sense amplifier circuit 21 further comprises a fifth N type MOS transistor M19 for connecting the source nodes of the first, second, third and fourth N type MOS transistors M3, M4, M7 and M8 to the ground voltage (GND) node in common in response to an operation enable signal (EN).

The bias voltage generator 40 comprises third and fourth P type MOS transistors M9 and M10 having source nodes each connected to first and second dummy sensing inputs VP and VN, and gate and drain nodes being cross-coupled to each other. The bias voltage generator 40 further comprises sixth and seventh N type MOS transistors M11 and M12 having drain nodes each connected to first and second dummy sensing outputs DS and /DS, the first and second dummy sensing outputs being the drain nodes of the third and fourth P type MOS transistors, and gate nodes connected to the power supply voltage apply node in common. The bias voltage generator 40 further comprises eighth and ninth N type MOS transistors M15 and M16 having drain nodes each connected to the first and second dummy sensing outputs DS and /DS and gate nodes connected to the bias voltage (VBIAS) apply node in common, so that a current path is established from the first and second dummy sensing outputs DS and /DS to the ground. The bias voltage generator 40 further comprises a tenth N type MOS transistor M18 for fixedly connecting the source nodes of the sixth, seventh, eighth and ninth N type MOS transistors to the ground voltage node in common. And, the bias voltage generator 40 further comprises an operational amplifier C1 having a non-inverting input node (+) and an inverting input node (−) each connected to the first and second dummy sensing inputs VP and VN, and an output node connected to the bias voltage (VBIAS) apply node, wherein the operational amplifier C1 adjusts a bias voltage at the bias voltage (VBIAS) apply node so that the non-inverting input node (+) and the inverting input node (−) become approximately the same voltage level.

Figure 2:
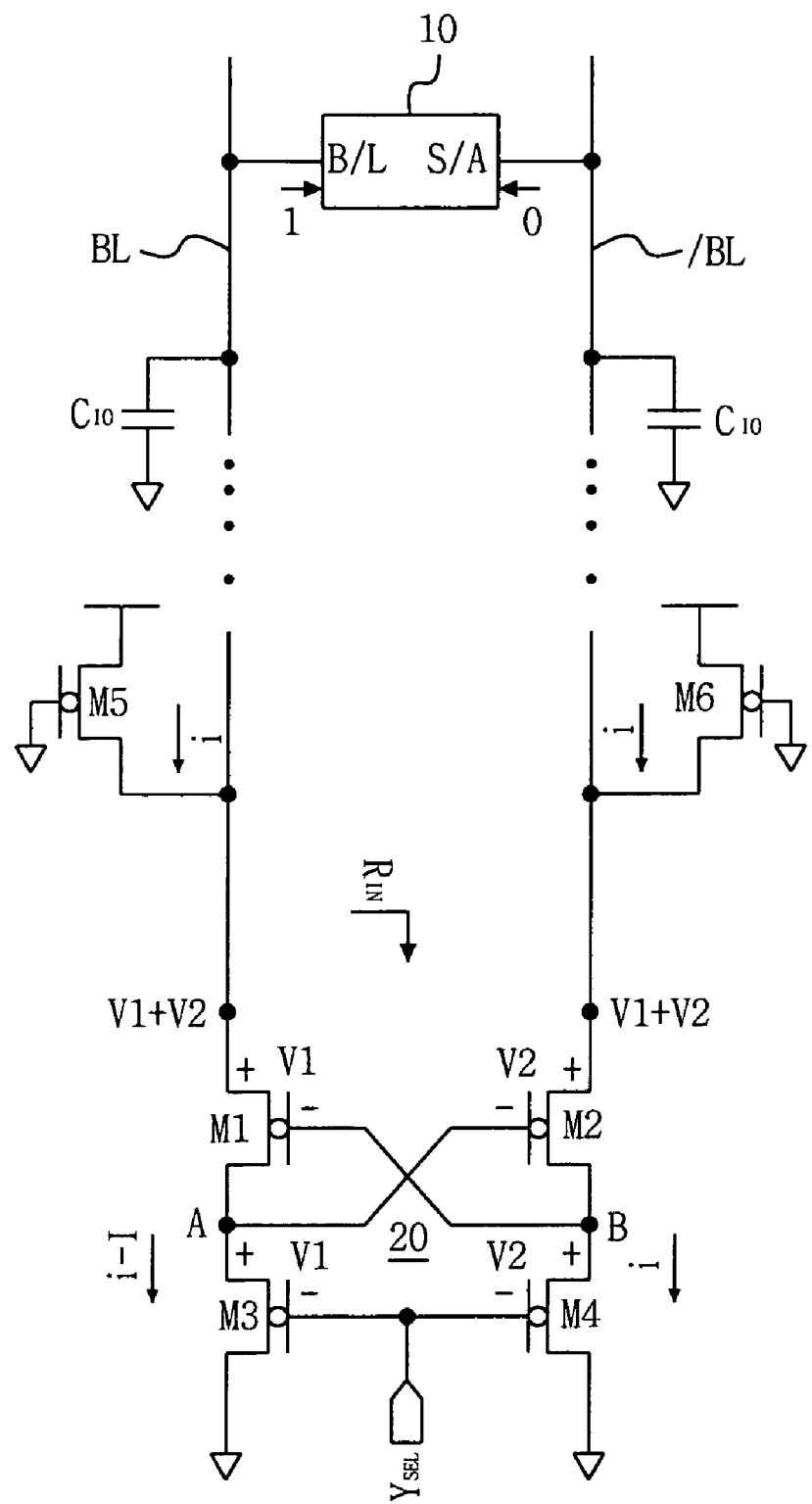
FIG. 2 is a circuit schematic that illustrates exemplary operations of a conventional current sense amplifier circuit, which is used in a DRAM application.
Figure 3:
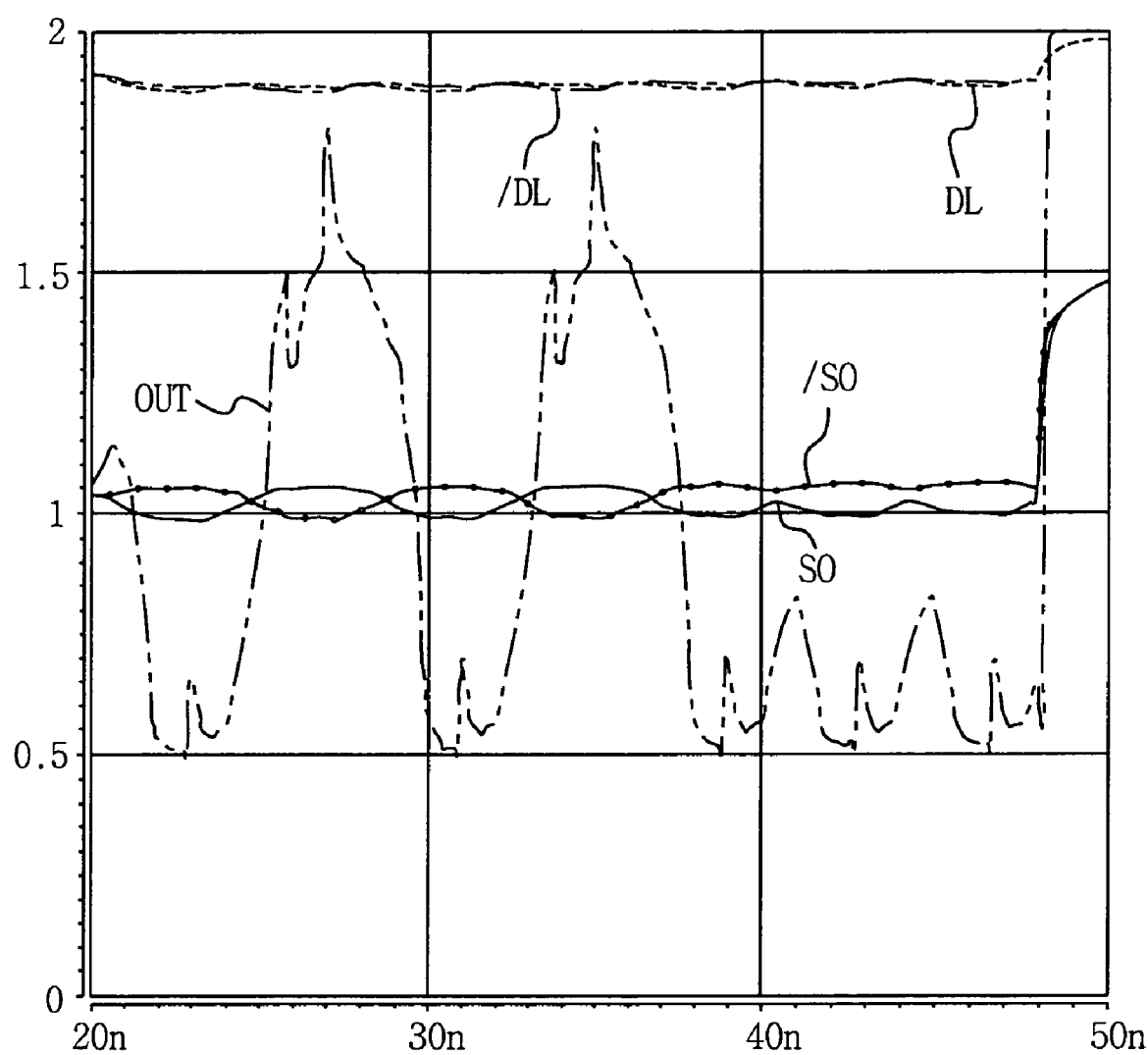
FIG. 3 is a diagram that illustrates simulation waveforms of signals related to a sensing output of FIG. 1.

Differential inputs of the voltage amplifying differential amplifier 30 may be connected to the first and second sensing outputs SO and /SO of the current sense amplifier as shown in FIG. 1.

In FIG. 6, the input resistance $R_{IN}$ is maintained to be about zero by controlling the voltages across the gate nodes of the NMOS transistors M7 and M8, even though the PVT varies. Operation speed may be improved at a low voltage and operation stability may be improved even at a high power supply voltage.

From a comparison between the configurations of FIGS. 6 and 1, it can be seen that the NMOS transistors M3 and M4 in FIG. 6 are substituted for the PMOS transistors M3 and M4 in FIG. 1. Here, the voltage applied to the gates of the NMOS transistors M3 and M4 in FIG. 6 is a power supply voltage VDD. The NMOS transistors M7 and M8 are connected to the NMOS transistors M3 and M4, respectively. The voltage applied to the gate nodes of the NMOS transistors M7 and M8 becomes a bias voltage VBIAS.

The bias voltage VBIAS is generated by the bias voltage generator 40. Transistors M9, M10, M11, M12, M15, M16 and M18 comprising the bias voltage generator 40 may each be formed as the same size as that of transistors M1, M2, M3, M4, M7, M8 and M19 comprising the current sense amplifier 21. A fixed bit line sense amplifier (fixed B/L S/A) 15 is configured in the same form as the bit line sense amplifier 10, but its value is not determined by the data in the memory cell but is fixedly latched as either 0 or 1. It can be implemented by supplying power only to one output upon power-up. After the power-up is completed, the fixed bit line sense amplifier 15 continues to maintain a constant data value.

The fixed bit line sense amplifier 15 may be formed using the same manufacturing process, even in an area where a plurality of bit line sense amplifiers 10 is configured. On the other hand, when the fixed bit line sense amplifier 15 is disposed in a peripheral circuit area rather than a memory cell array area where memory cells are positioned, there may be a small characteristic difference with the bit line sense amplifier 10. However, because the characteristic difference does not cause a problem in operating the circuit of FIG. 6, the fixed bit line sense amplifier 15 may be disposed in the peripheral circuit area.

The operational amplifier C1 (hereinafter, referred to as OPAMP) adjusts the gate voltages of the transistors M15 and M16, namely, the levels of the bias voltage VBIAS so that the VP and VN voltages have about the same value. The configuration and operation of the OPAMP used herein are well known in the art and, therefore, further explanation will be omitted.

In FIG. 6, if VN>VP, namely, $R_{IN}$>0, then the OPAMP C1 reduces the VBIAS voltage. In turn, current pass resistance of the transistors M15 and M16 is increased resulting in reduced input resistance $R_{IN}$. On the contrary, if VN<VP, namely, $R_{IN}$<0, then the OPAMP C1 increases the VBIAS voltage. In turn, the current pass resistance is reduced resulting in increased input resistance $R_{IN}$. As a result, because the same VBIAS voltage is applied to an actual current sense amplifier, the input resistance of the current sense amplifier may be near zero even when the PVT varies.

An OPAMP with a minimum offset may be used in some embodiments because the input resistance $R_{IN}$ may be fixed to a value deviated from zero when the OPAMP C1 used in FIG. 6 has an offset. However, when an offset value of the OPAMP is already known, the transistors M15 and M16 and the transistors M7 and M8 may be a little different from each other in size to compensate for the offset.

Figure 7:
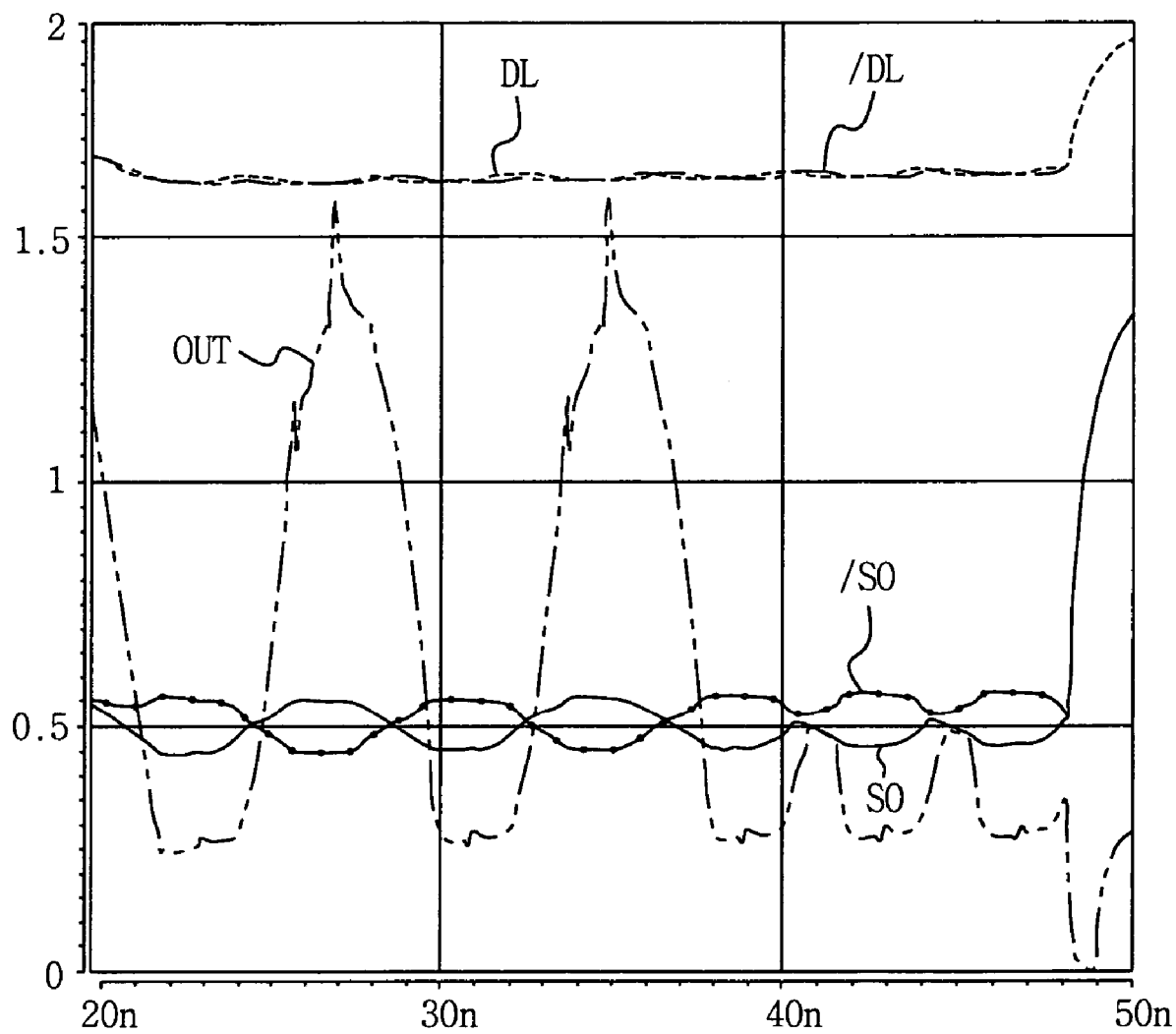
FIG. 7 is a diagram showing simulation waveforms of signals related to a sensing output of the circuit of FIG. 6.

FIG. 7 is a diagram showing simulation waveforms of signals related to a sensing output of the circuit of FIG. 6. There is shown a result obtained by simulation-measuring voltages of the pair of data lines DL and /DL, which are the inputs to the current sense amplifier 21, voltages on the sensing outputs SO and /SO, and a voltage on the output OUT of the differential amplifier 30 while changing the data of the bit line sense amplifier 10 in the circuit of FIG. 7. In the figure, an abscissa axis denotes a time and an ordinate axis denotes a voltage.

As shown in FIG. 7, the voltages on the pair of data lines DL and /DL are within a mV. Here, a sensing change period of the bit line sense amplifier 10 is 4 ns, and opposite data is input for the first three cycles while the same data is input for the subsequent three cycles. Swing voltages at the sensing output nodes SO and /SO become greater as the input resistance $R_{IN}$ becomes smaller. The input resistance $R_{IN}$, therefore, may be zero to obtain the maximum swing voltages on the sensing output nodes SO and /SO along with a stable operation. It can be seen that the greater swing voltages on the sensing output nodes SO and /SO enhances an operation speed of the voltage amplifying differential amplifier 30 connected to a subsequent stage, thereby reducing the sensing delay.

Figure 4:
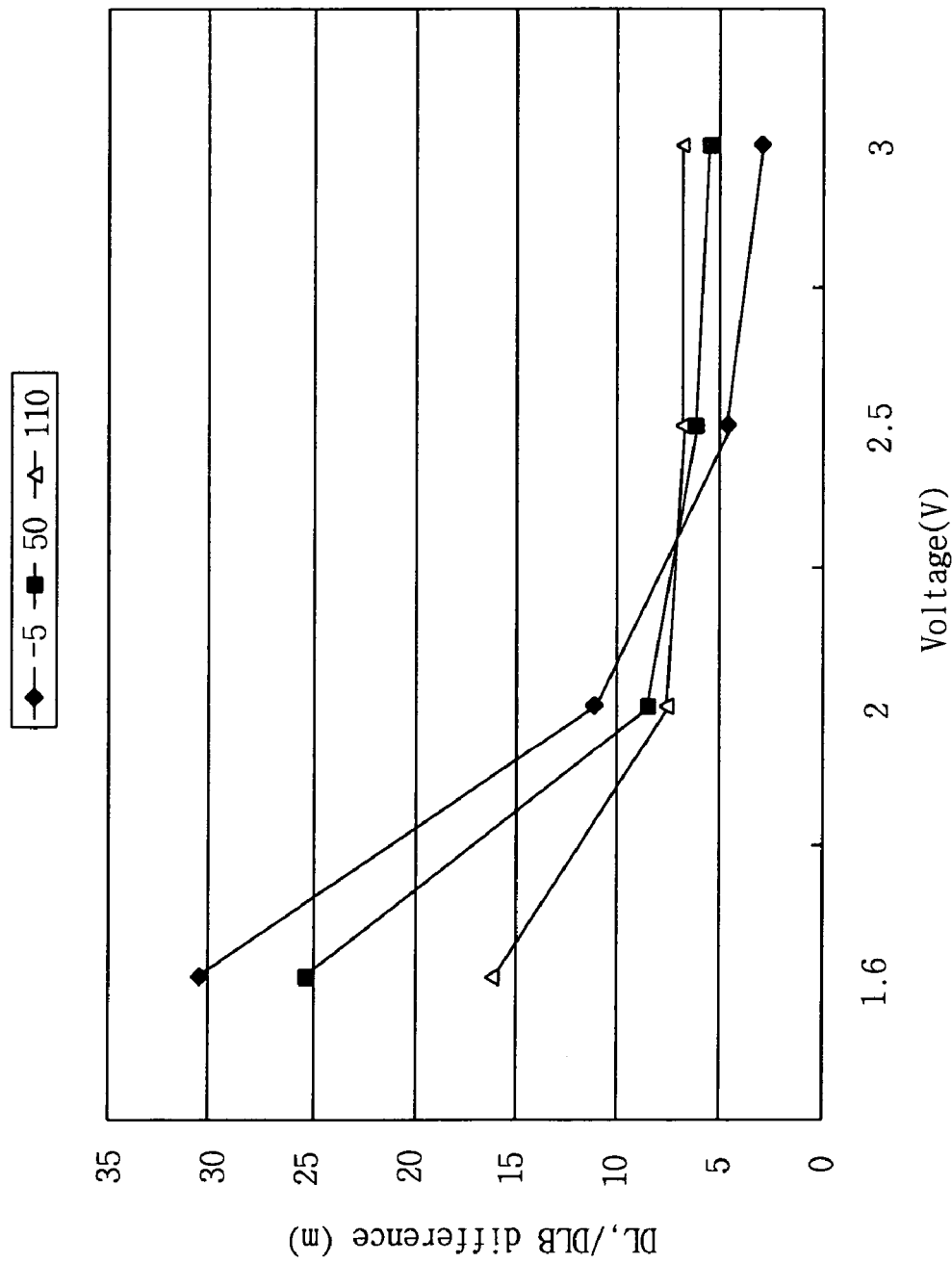
FIG. 4 is a graph that illustrates maximum voltage difference between a pair of data lines generated when external environment factors change in the circuit of FIG. 1.
Figure 8:
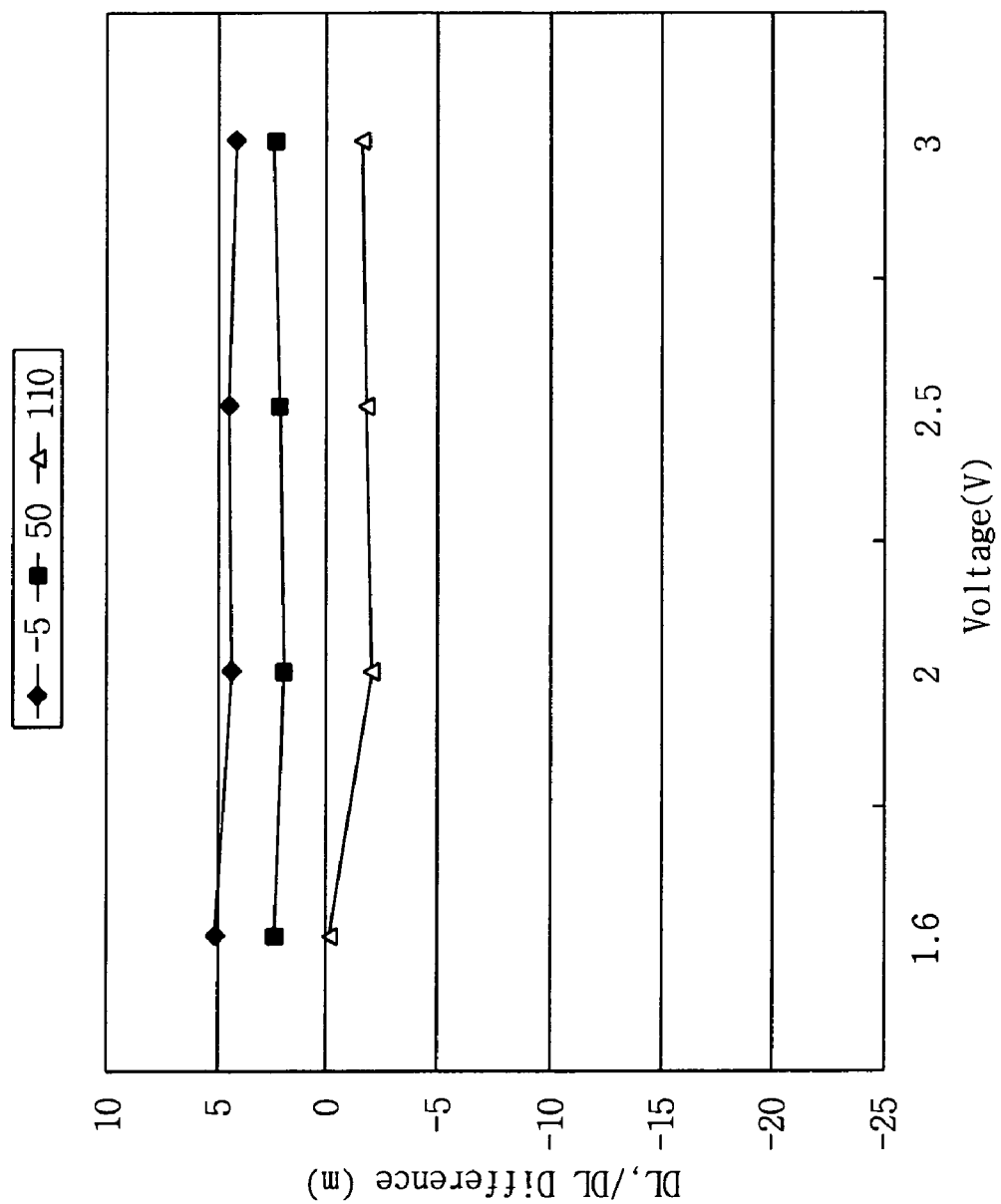
FIG. 8 is a graph showing a maximum measured voltage difference between a pair of data lines generated when external environment factors are changed in the circuit of FIG. 6.

FIG. 8 is a graph showing a maximum measured voltage difference between a pair of data lines generated when external environment factors are changed in the circuit of FIG. 6. That is, the results are obtained by measuring and plotting voltages on the pair of data lines DL and /DL based on voltage and temperature change. In comparison with the prior art results illustrated in FIG. 4, it can be seen that the change in the input resistance $R_{IN}$ based on voltage and temperature change has been greatly reduced.

Figure 5:
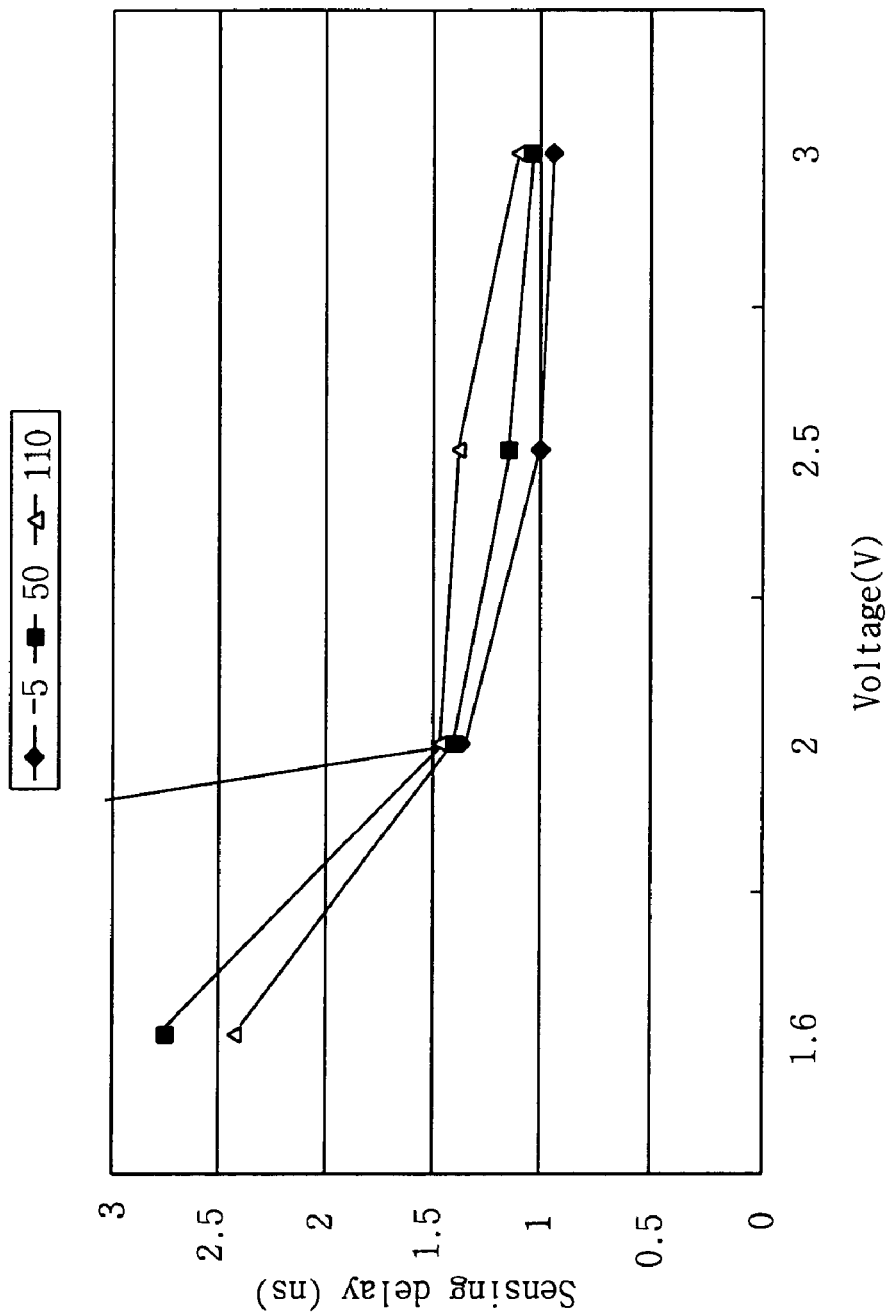
FIG. 5 shows results obtained by simulation-measuring a sensing delay in the circuit of FIG. 1.
Figure 9:
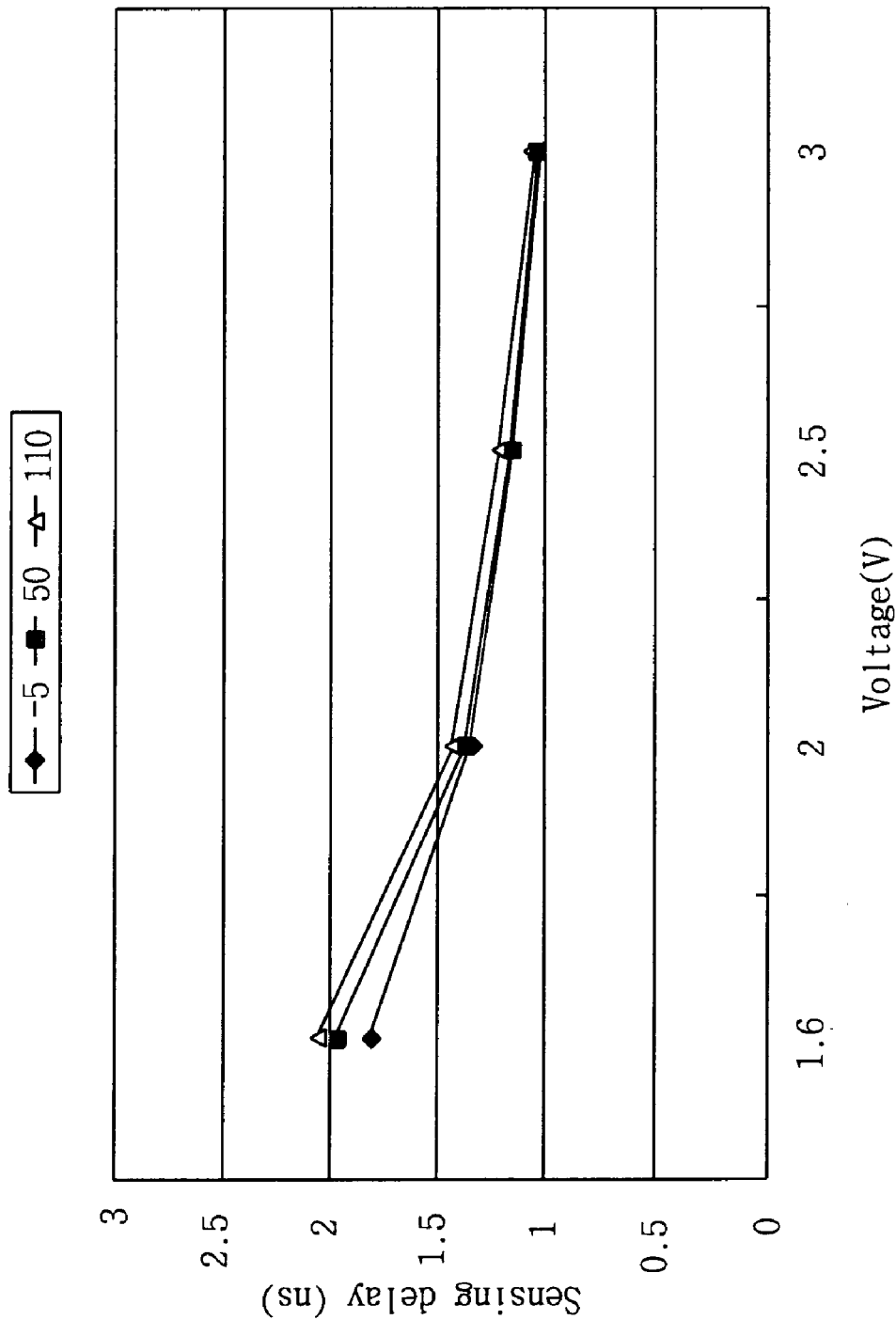
FIG. 9 is a diagram showing a graph obtained by simulation-measuring a sensing delay generated by the circuit of FIG. 6.

FIG. 9 is a diagram showing a graph obtained by simulation-measuring a sensing delay generated by the circuit of FIG. 6. Comparing FIG. 5 with FIG. 9, it can be seen that the latter has a reduced sensing delay. That is, it can be seen that some embodiments of the present invention address a problem with the prior art that sensing delay increases due to a reduced output swing voltage in the current sense amplifier.

Figure 10:
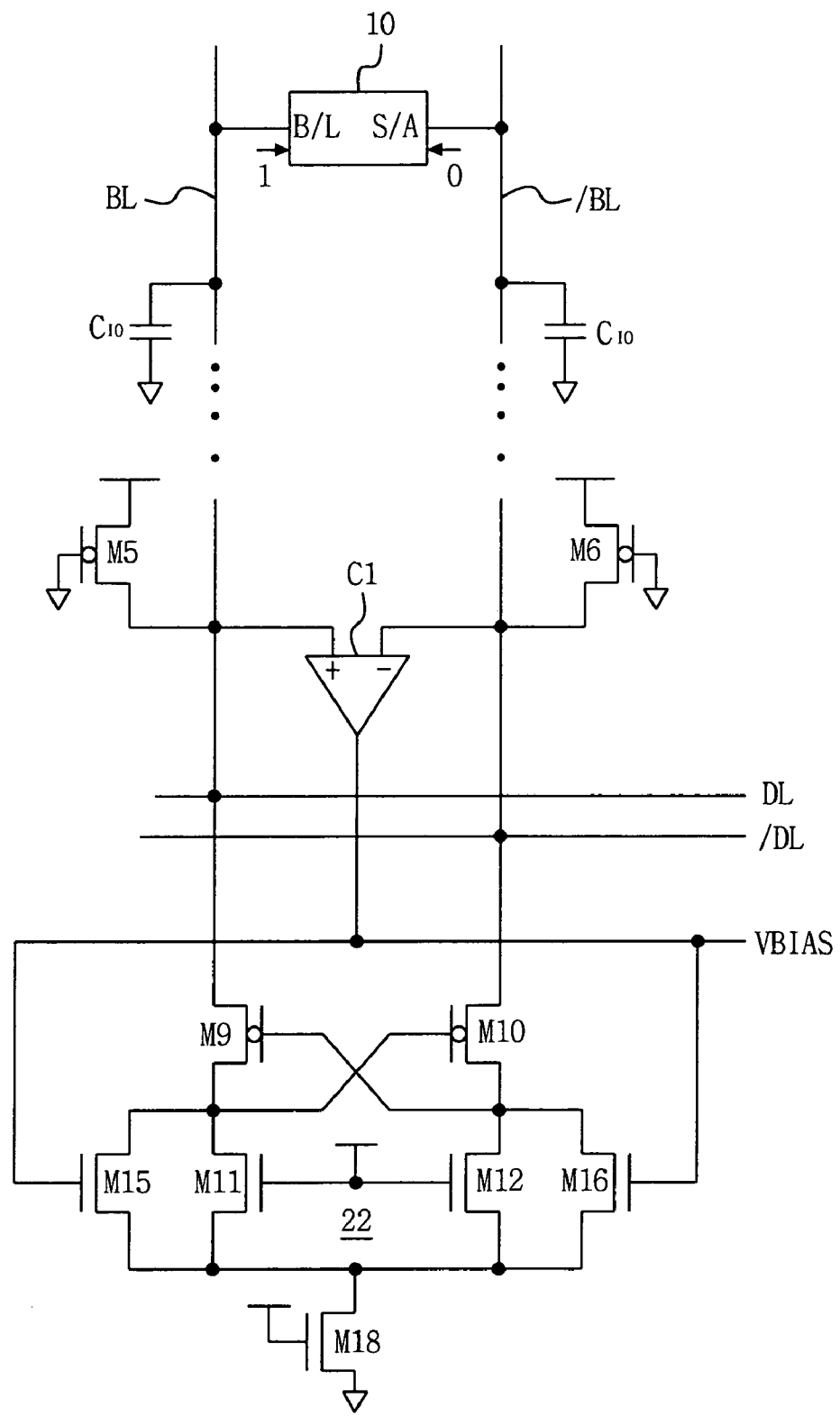
FIG. 10 is a schematic of a sensing circuit according to further embodiments of the present invention.

FIG. 10 is a diagram that illustrates a current sense amplifier circuit according to further embodiments of the present invention. Referring to FIG. 10, the current sense amplifier 22 comprises first and second P type MOS transistors M9 and M10 having source nodes each connected to first and second sensing inputs DL and /DL, and gate nodes and drain nodes being cross-coupled to each other. First and second N type MOS transistors M11 and M12 have drain nodes each connected to the first and second sensing outputs, the first and second sensing outputs being the drain nodes of the first and second P type MOS transistors, and gate nodes connected to a power supply voltage apply node in common. Third and fourth N type MOS transistors M15 and M16 have drain nodes each connected to the first and second sensing outputs and gate nodes connected to the bias voltage apply node in common so that a current path is established from the first and second sensing outputs to the ground. A fifth N type MOS transistor M18 connects source nodes of the first, second, third, and fourth N type MOS transistors in common to a ground voltage node in response to an operation enable signal. An operational amplifier C1 has non-inverting and inverting input nodes each connected to the first and second dummy sensing inputs and an output node connected to the bias voltage apply node. The operational amplifier adjusts the bias voltage on the bias voltage apply node so that voltage levels on the non-inverting and inverting input nodes are about the same.

As a result, the current sense amplifier circuit of FIG. 10 comprises the operational amplifier C1 and the transistors without a plurality of transistors constituting the bias voltage generator as shown in FIG. 6. In this case, because the input nodes of the operational amplifier C1 are each connected to the nodes of the pair of data lines DL and /DL of the current sense amplifier 22, and the output nodes of the operational amplifier C1 are connected to the gate nodes of the transistors M15 and M16, the gate voltages of the transistors M15 and M16 maybe adjusted. Transconductance is accordingly adjusted so that maintaining the input resistance at about zero is realized in a substantially similar manner as described above with respect to FIG. 6.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

The invention claimed is:

1. A current sense amplifier circuit, comprising:
   first and second P type MOS transistors having source nodes connected to first and second sensing inputs, respectively, and gate and drain nodes being cross-coupled to each other;
   first and second N type MOS transistors having drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage; and
   third and fourth N type MOS transistors having drain nodes connected to the first and second sensing outputs, respectively, and gate nodes connected to a bias voltage node so that respective current paths are established from the first and second sensing outputs to a common reference node.

2. The current sense amplifier circuit of claim 1, further comprising:
   a fifth N type MOS transistor that connects the source nodes of the first, second, third, and fourth N type MOS transistors to the common reference node responsive to an operation enable signal.

3. The current sense amplifier circuit of claim 1, further comprising:
   an operational amplifier having non-inverting and inverting input nodes connected to the first and second sensing inputs, respectively, and an output node connected to the bias voltage node, wherein the operational amplifier generates a bias voltage at the output node thereof so that the non-inverting input node and the inverting input node are driven to about a same voltage level.

4. The current sense amplifier circuit of claim 1, further comprising a bias voltage generator that supplies a bias voltage to the bias voltage node.

5. The current sense amplifier circuit according to claim 4, wherein the bias voltage generator comprises:
   third and fourth P type MOS transistors having source nodes connected to first and second dummy sensing inputs, respectively, and gate and drain nodes being cross-coupled to each other;
   sixth and seventh N type MOS transistors having drain nodes connected to the first and second dummy sensing outputs, respectively, the first and second dummy sensing outputs corresponding to the drain nodes of the third and fourth P type MOS transistors, the sixth and seventh N type MOS transistors having gate nodes connected to the power supply voltage;

eighth and ninth N type MOS transistors having drain nodes connected to the first and second dummy sensing outputs, respectively, and gate nodes connected to the bias voltage node so that a current path is established from the first and second dummy sensing outputs to the common reference node;

a tenth N type MOS transistor that fixedly connects the source nodes of the sixth, seventh, eighth and ninth N type MOS transistors to the common reference node; and an operational amplifier having non-inverting and inverting input nodes connected to the first and second dummy sensing inputs, respectively, and an output node connected to the bias voltage node, wherein the operational amplifier generates a bias voltage at the output node thereof so that the non-inverting input node and the inverting input node are driven to about a same voltage level.

6. The current sense amplifier circuit according to claim 5, wherein the first and second P type MOS transistors are about the same size as the third and fourth P type MOS transistors, respectively, and the first, second, third, and fourth N type MOS transistors are about the same size as the sixth, seventh, eighth, and ninth N type MOS transistors, respectively.

7. A current sense amplifier circuit, comprising:
first and second P type MOS transistors having source nodes connected to first and second sensing inputs, respectively, and gate and drain nodes being cross-coupled to each other;

first and second N type MOS transistors having drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage;

third and fourth N type MOS transistors having drain nodes connected to the first and second sensing outputs, respectively, and gate nodes connected to a bias voltage node so that respective current paths are established from the first and second sensing outputs to a common reference node;

a fifth N type MOS transistor that connects the source nodes of the first, second, third, and fourth N type MOS transistors to the common reference node responsive to an operation enable signal; and a bias voltage adjustment circuit that supplies a bias voltage to the bias voltage apply node so that voltage levels at the first and second sensing inputs are about identical to each other.

8. The current sense amplifier circuit according to claim 7, wherein the bias voltage adjustment circuit comprises an operational amplifier having non-inverting and inverting input nodes connected to the first and second sensing inputs, respectively, and an output node connected to the bias voltage node.

9. The current sense amplifier circuit according to claim 8, wherein the first and second sensing inputs are connected to a data line and a complementary data line, respectively.

10. The current sense amplifier circuit according to claim 9, further comprising:
P type MOS transistors that are connected to the data line and the complementary data line, respectively.

11. The current sense amplifier circuit according to claim 10, further comprising:
a differential amplifier circuit that is connected to the first and second sensing outputs.

12. A semiconductor memory device sensing circuit, comprising:
a current sense amplifier comprising first and second P type MOS transistors having source nodes connected to first and second sensing inputs, respectively, and gate and drain nodes being cross-coupled to each other, first and second N type MOS transistors having drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage, third and fourth N type MOS transistors having drain nodes connected to the first and second sensing outputs, respectively, and gate nodes connected to a bias voltage node so that respective current paths are established from the first and second sensing outputs to a common reference node, and a fifth N type MOS transistor that connects the source nodes of the first, second, third, and fourth N type MOS transistors to the common reference node responsive to an operation enable signal;

a bias voltage generator comprising third and fourth P type MOS transistors having source nodes connected to first and second dummy sensing inputs, respectively, and gate and drain nodes being cross-coupled to each other, sixth and seventh N type MOS transistors having drain nodes connected to the first and second dummy sensing outputs, respectively, the first and second dummy sensing outputs corresponding to the drain nodes of the third and fourth P type MOS transistors, the sixth and seventh N type MOS transistors having gate nodes connected to the power supply voltage, eighth and ninth N type MOS transistors having drain nodes connected to the first and second dummy sensing outputs, respectively, and gate nodes connected to the bias voltage node so that a current path is established from the first and second dummy sensing outputs to the common reference node, a tenth N type MOS transistor that fixedly connects the source nodes of the sixth, seventh, eighth and ninth N type MOS transistors to the common reference node, and an operational amplifier having non-inverting and inverting input nodes connected to the first and second dummy sensing inputs, respectively, and an output node connected to the bias voltage node, wherein the operational amplifier generates a bias voltage at the output node thereof so that the non-inverting input node and the inverting input node are driven to about a same voltage level; and a differential amplifier circuit that is connected to the first and second sensing outputs.

13. A dynamic random access memory (DRAM) data sensing circuit, comprising:
first and second P type MOS transistors having source nodes connected to first and second sensing inputs, respectively, and gate and drain nodes being cross-coupled to each other;

first and second N type MOS transistors having drain nodes connected to first and second sensing outputs, respectively, the first and second sensing outputs corresponding to the drain nodes of the first and second P type MOS transistors, respectively, the first and second N type MOS transistors having respective gate nodes connected to a power supply voltage;

third and fourth N type MOS transistors having drain nodes connected to the first and second sensing outputs, respectively, and gate nodes connected to a bias voltage node so that respective current paths are established from the first and second sensing outputs to a common reference node;

a fifth N type MOS transistor that connects the source nodes of the first, second, third, and fourth N type MOS transistors to the common reference node responsive to an operation enable signal;

an operational amplifier having non-inverting and inverting input nodes connected to the first and second sensing inputs, respectively, and an output node connected to the bias voltage node, wherein the operational amplifier generates a bias voltage at the output node thereof so that the non-inverting input node and the inverting input node are driven to about a same voltage level; and a differential amplifier circuit that is connected to the first and second sensing outputs.

* * * * *